(12) United States Patent
Suzuki et al.

(10) Patent No.: US 6,558,505 B2
(45) Date of Patent: May 6, 2003

(54) METHOD AND APPARATUS FOR PROCESSING SEMICONDUCTOR SUBSTRATES

(75) Inventors: Katsunori Suzuki, Hagamachi (JP); Hidetaka Horiuchi, Hagamachi (JP); Yasushi Kikuchi, Hagamachi (JP); Jin Yokogawa, Hagamachi (JP); Ryouichi Kubo, Hagamachi (JP); Koji Wakabayashi, Hagamachi (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/142,998

(22) Filed: May 13, 2002

(65) Prior Publication Data

US 2003/0029565 A1 Feb. 13, 2003

Related U.S. Application Data

(62) Division of application No. 09/449,347, filed on Nov. 24, 1999, now Pat. No. 6,447,853.

(30) Foreign Application Priority Data

Nov. 30, 1998 (JP) ............................................. 10-339978

(51) Int. Cl.⁷ ........................ H05H 1/00; C23C 16/00; H01L 2/00
(52) U.S. Cl. ............................ 156/345.3; 156/345.51; 118/728; 427/585; 438/689
(58) Field of Search ........................ 156/345.3, 345.51; 118/728, 715, 720, 721, 716; 427/585, 569, 534, 535; 438/689, 706, 710

(56) References Cited

U.S. PATENT DOCUMENTS

| 5,226,383 A | 7/1993 | Bhat ........................... 118/730 |
| 5,382,311 A | 1/1995 | Ishikawa et al. ............ 156/345 |
| 5,474,649 A | 12/1995 | Kava et al. |
| 5,985,033 A | 11/1999 | Yudovsky et al. .......... 118/715 |
| 6,027,604 A | 2/2000 | Lim et al. .................... 156/345 |
| 6,136,710 A | 10/2000 | Quek et al. .................. 156/345 |
| 6,245,152 B1 | 6/2001 | Imai et al. ................... 118/728 |
| 6,245,193 B1 | 6/2001 | Quek et al. .................. 156/345 |
| 6,248,176 B1 | 6/2001 | Yudovsky et al. .......... 118/715 |
| 6,251,215 B1 | 6/2001 | Zuniga et al. ............... 156/345 |

FOREIGN PATENT DOCUMENTS

| EP | 0882 812 A1 | 12/1996 |
| JP | A-6-196421 | 7/1994 |
| JP | 10-036965 | 2/1998 |
| JP | A-10-163180 | 6/1998 |
| JP | 2001-7090 A | 1/2001 |

*Primary Examiner*—Gregory Mills
*Assistant Examiner*—P. Hassanzadeh
(74) *Attorney, Agent, or Firm*—Oliff & Berridge, PLC

(57) ABSTRACT

Apparatus and methods for producing semiconductor devices are disclosed. A processing chamber includes an interior component having a stepped region including a plurality of raised sections and recessed sections divided by steps. With this apparatus, it is possible to prevent a film of deposited material formed on the stepped region from peeling, thereby decreasing the number of particles in the chamber and increasing the operation rate.

18 Claims, 11 Drawing Sheets

FIG. 3 (a)
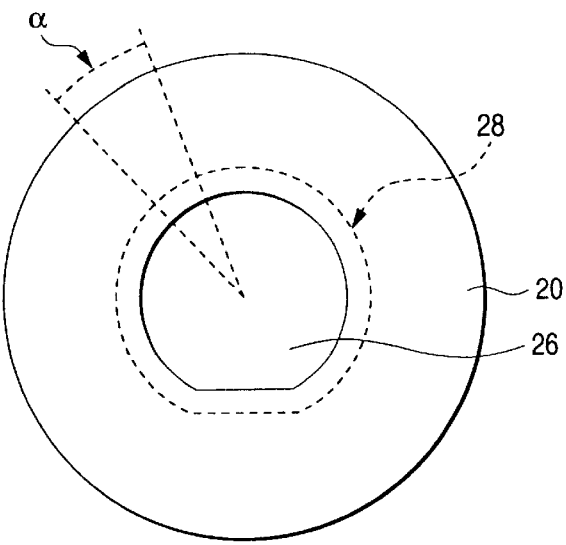
FIG. 3 (b)
FIG. 3 (c)
FIG. 3 (d)
FIG. 3 (e)
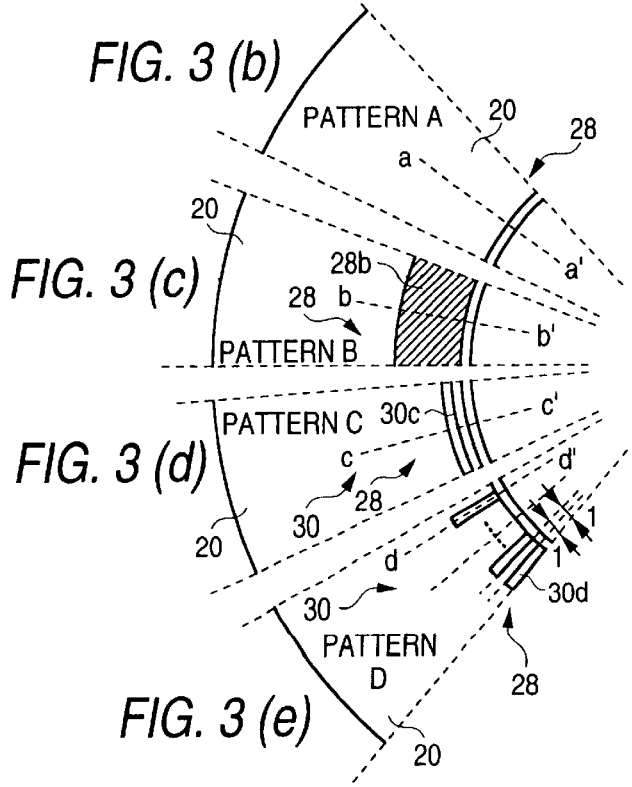
FIG. 3 (f)
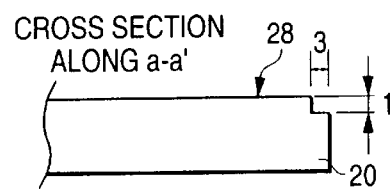
FIG. 3 (g)
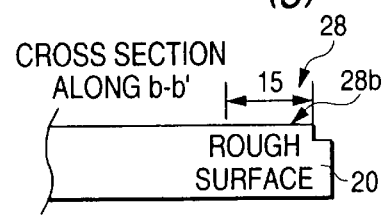
FIG. 3 (h)
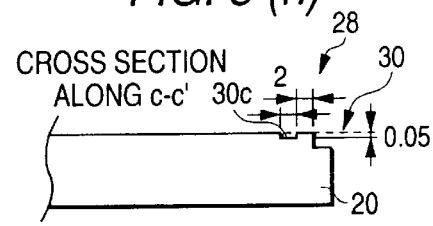
FIG. 3 (i)
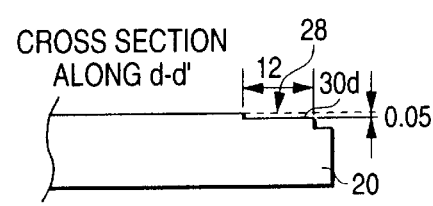

METHOD AND APPARATUS FOR PROCESSING SEMICONDUCTOR SUBSTRATES

This is a Division of application No. 09/449,347 filed Nov. 24, 1999, now U.S. Pat. No. 6,747,852. The entire disclosure of the prior application(s) is hereby incorporated by reference herein in its entirety.

BACKGROUND OF THE INVENTION

1. Field of Invention

The present invention relates to an apparatus for performing processing in the production of semiconductor devices, such as integrated circuits. The present invention also relates to a method of preventing a deposited film within the apparatus from peeling. The apparatus for treatment is suitable for dry etching and plasma CVD.

2. Description of Related Art

Production of semiconductor devices employs various technologies, such as dry etching and CVD. They are designed to etch surface layers on semiconductor substrates or form films on substrates by plasma decomposition or thermal decomposition of gases. Parts of decomposition products are inevitably deposit and build-up on interior components within the processing chamber, including the inner wall of a processing chamber itself. Resulting film of deposited material peels and generates particles within the chamber, or drops off on the substrate to form apparent defects.

In order to circumvent this problem, it is necessary to perform mechanical cleaning periodically on the processing apparatus. Unfortunately, mechanical cleaning takes a long time because it requires that the chamber be opened. Once opened, the chamber needs temperature adjustment and complete evacuation prior to restarting the processing. Hence, the mechanical cleaning greatly redness the operation rate of the apparatus. Therefore, several methods have been proposed to reduce the frequencies of mechanical cleaning.

One of them is dry cleaning with various reactive gases. Dry cleaning evaporates and removes the deposited materials and reduces the generation of particles. However, dry cleaning usually employs a plasma-excited gas. Therefore, the cleaning is incomplete in the area that is not exposed to the plasma. This is true particularly for an apparatus of parallel plate structure with a narrow gap, since the plasma in a narrow gap apparatus is confined in a limited portion within the chamber. Similarly, dry cleaning with a gas excited by any other known method than plasma cannot achieve complete cleaning in the chamber.

A method to prevent deposited films from peeling is disclosed in Japanese Patent Laid-open Nos. 196421/1994 and 163180/1998 and U.S. Pat. No. 5,474,649. It achieves the object by roughening the surface of the inner wall of the chamber, or the surface of interior components in the chamber, for good adhesion of the deposited film. This surface roughening is accomplished by frost treatment (bead blasting), engraving, etching, molding, or the like.

However, the frost treatment is effective only so long as the film of deposited material is relatively thin and has a relatively small internal stress. As the deposited film grows to tens or hundreds of micrometers thick, the adhesion strength produced by frost treatment is not enough to keep it on the inner wall of the chamber or the surface of the interior components.

On the other hand, various interior components in the processing chamber, including inner wall of the chamber itself of the apparatus for dry etching and CVD, often have a surface coated layer. Such costing on the surface may peel after repeated use due to deterioration. This also poses a problem as in the case of the peeling of deposited materials mentioned above.

In order to solve this problem, there has been proposed an idea of replacing the deteriorated parts. To put this idea into practice, there has been proposed a processing chamber which is provided with an inner wall of double layer structure so that the deteriorated part can be removed for replacement.

However, the inner wall of double-layer structure still requires periodic replacement. Hence it is not quite helpful to reduce the frequency of opening the chamber. There still exists a problem of a low operation rate.

SUMMARY OF THE INVENTION

The present invention addresses the above-mentioned problems. It is an object of the present invention to provide an apparatus and a method for processing semiconductor substrates in the production of semiconductor devices. It is another object of the present invention to provide a method of preventing deposited film in said apparatus from peeling. The apparatus and method according to the present invention prevent deposited film and surface coating from peeling, thereby reducing particles in the chamber and increasing the operation rate of the apparatus.

According to one aspect of the present invention, an apparatus for processing a workpiece for production of semiconductor devices comprises a processing chamber that mounts the workpiece, the processing chamber including an interior component having a stepped surface region comprising a plurality of sectioned areas divided by steps.

Preferably, the sectioned areas arranged according to the temperature gradient produced on the surface of the component during operation of the apparatus.

Preferably, the stepped region is located in a position where a film of deposited material is formed thereon during operation of the apparatus; and the steps are high enough to prevent the deposited film from peeling.

Still preferably, the stepped region is located in a position where a film of deposited material is formed thereon during operation of the apparatus; and the sectioned surface region prevents the deposited film from peeling by dividing the deposited film into sections having appropriate sizes.

According to another aspect of the invention, a method to prevent peeling of a deposited film in an apparatus used in production of a semiconductor device, comprises providing a processing chamber that mounts a workpiece to be processed therein, the processing chamber including an interior component having a stepped surface region comprising a plurality of sectioned areas divided by steps; processing the workpiece in the processing chamber while forming a film of deposited material on the stepped surface region; wherein the steps are high enough to prevent the deposited film from peeling.

According to another aspect of the invention, a method of processing a semiconductor substrate comprises: providing a stepped region on a surface of an interior component in a processing chamber, the stepped region including a plurality of sectioned areas divided by steps; placing a semiconductor substrate to be processed in the processing chamber; and processing the semiconductor substrate within the processing chamber while forming a film of deposited material on the stepped region; wherein the steps are provided such that the deposited film is effectively divided.

Preferably, the sectioned areas include a plurality of raised sections and recessed sections divided by the steps, and adjacent raised sections are sufficiently separated to effectively divide the deposited film.

Preferably, angles of the steps are sufficient to effectively divide the deposited film.

Preferably, the steps are sufficiently high so that the film is effectively divided.

Still preferably, the method further comprises repeating the placing and processing until a cumulative time of the processing reaches a predetermined value; wherein the steps are provided such that the deposited film is effectively divided so that peeling of the film built-up during the predetermined cumulative processing time is prevented.

According to another aspect of the invention, a method of processing a semiconductor substrate comprises: providing a stepped region on a surface of an interior component in a processing chamber, the stepped region including a plurality of raised sections divided by grooves; placing a semiconductor substrate to be processed in the processing chamber; and processing the semiconductor substrate within the processing chamber while forming a film of deposited material on the stepped region; wherein the steps extend substantially perpendicular relative to the sectioned areas.

According to another aspect of the invention, a method of processing a semiconductor substrate comprises: providing a stepped region on a surface of an interior component in a processing chamber, the stepped region including a plurality of raised sections divided by grooves; placing a semiconductor substrate to be processed in the processing chamber; and processing the semiconductor substrate within the processing chamber while forming a film of deposited material on the stepped region; wherein the grooves are one-dimensional grooves.

Preferably, the film is deposited on a ring-shaped area, and the grooves are arranged generally perpendicular to a circumferential direction of the ring-shaped area.

Preferably, the interior component has an inner periphery surrounding the semiconductor substrate placed in the processing chamber, and the grooves are arranged in a vicinity of, and generally perpendicular to, the inner periphery of the component.

Preferably, a temperature gradient is produced on the stepped region during the processing of the substrate, and the grooves are arranged generally along directions of the temperature gradient.

According to another aspect of the invention, an interior component of a processing chamber that processes a semiconductor substrate, comprises: a stepped region including a plurality of sectioned areas divided by steps; wherein the steps extend substantially perpendicular relative to the sectioned areas.

According to another aspect of the invention, a focus ring that surrounds a semiconductor substrate in a plasma processing apparatus comprises: a stepped region formed in a vicinity of an inner periphery of the focus ring, the stepped region including a plurality of raised sections divided by grooves; wherein the grooves are arranged in a vicinity of, and generally perpendicular to, the inner periphery of the focus ring.

BRIEF DESCRIPTION OF THE DRAWINGS

FIG. 3(a) is a top view showing the lower quartz plate (together with a wafer placed at the center thereof) used in the apparatus for plasma etching as shown in FIG. 1.

FIGS. 3(b), 3(c), 3(d), and 3(e) are partial enlarged views of the part a of the plate.

FIGS. 3(f), 3(g), 3(h), and 3(i) are partial sectional views respectively taken along the line a—a' in FIG. 3(b), the line b—b' in FIG. 3(c), and the line c—c' in FIG. 3(d), and the line d—d' in FIG. 3(e).

DETAILED DESCRIPTION OF PREFERRED EMBODIMENTS

This invention was first disclosed in Japanese Patent Application No. 339978/1998, which is incorporated by reference.

A detailed description is made below, with reference to the accompanying drawings, which show preferred embodiments of the apparatus and method of processing semiconductor substrates according to the present invention and the method of preventing peeling of deposited film or coating layer via said apparatus.

Figure 1:
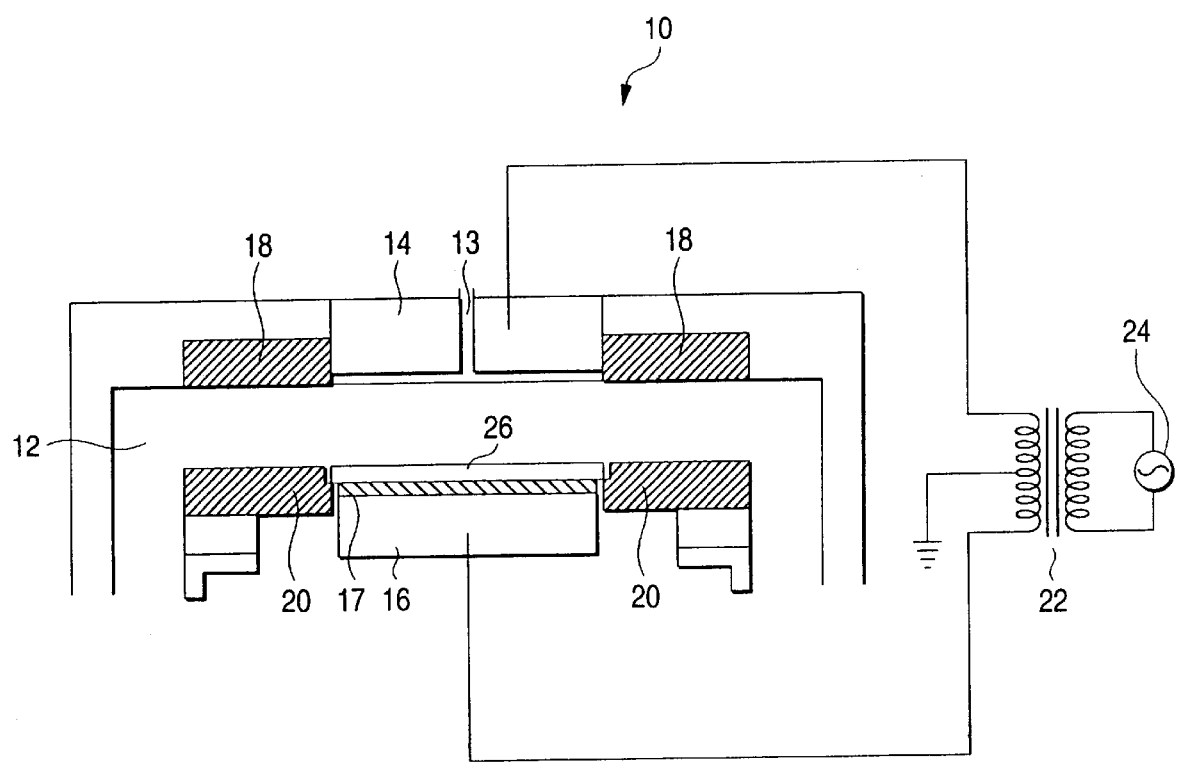
FIG. 1 is a schematic sectional view showing the apparatus for plasma etching according to the present invention.

FIG. 1 is a schematic sectional view showing the apparatus for plasma etching according to the present invention.

The plasma treating apparatus 10 shown in FIG. 1 is a dry etching apparatus for production of semiconductor devices. The apparatus generates high-frequency (RF) plasma that etches oxide film such as silicon oxide film and includes parallel plate electrodes, with a narrow gap between them. An work piece to be processed (a semiconductor wafer) is placed in a chamber 12 including various interior components. At the upper center of the chamber 12 is a round-shaped upper electrode 14, to which the gas inlet 13 is connected for introduction of etching gas. At the lower center of the chamber 12 is a round-shaped lower electrode 16, which is provided with an electrostatic chuck 17 to hold the wafer 26 to be processed. The upper electrode 14 is surrounded by an upper quartz plate 18, and the lower electrode 16 is surrounded by an lower quartz plate 20. The chamber 12 is connected to a RP power splitter 22 which applies high-frequency electric power (FR power) to the upper electrode 14 and the lower electrode 16. The power splitter 22 is connected to a RF power supply 24. These electrode units generate RF plasma in the chamber 12 for dry etching.

Figure 2:
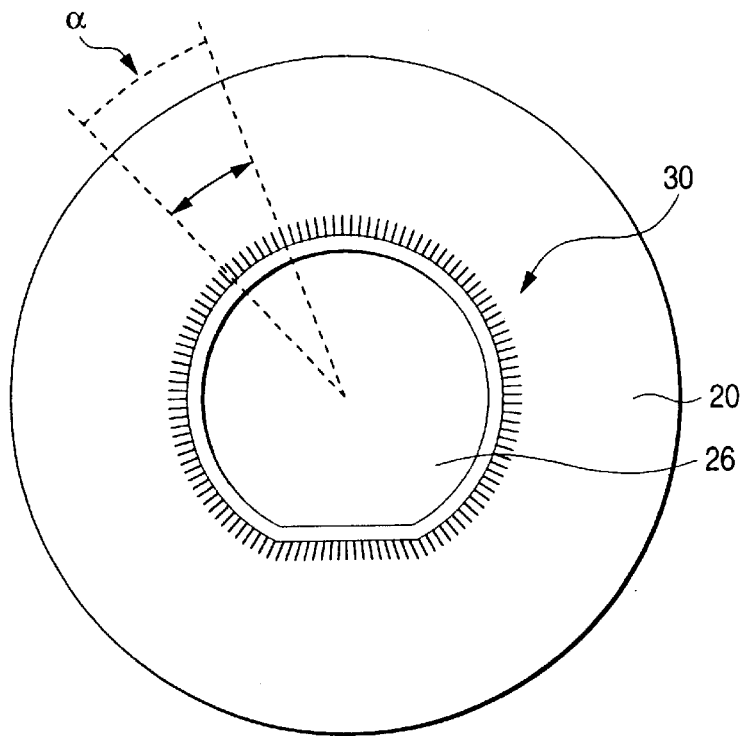
FIG. 2(a) is a top view showing the lower quartz plate used in the apparatus for plasma etching.
FIG. 2(b) is a partial enlarged view showing the part a in FIG. 2(a).
FIG. 2(c) is a partial sectional view taken along the line d—d' in FIG. 2(b).
Figure 2:
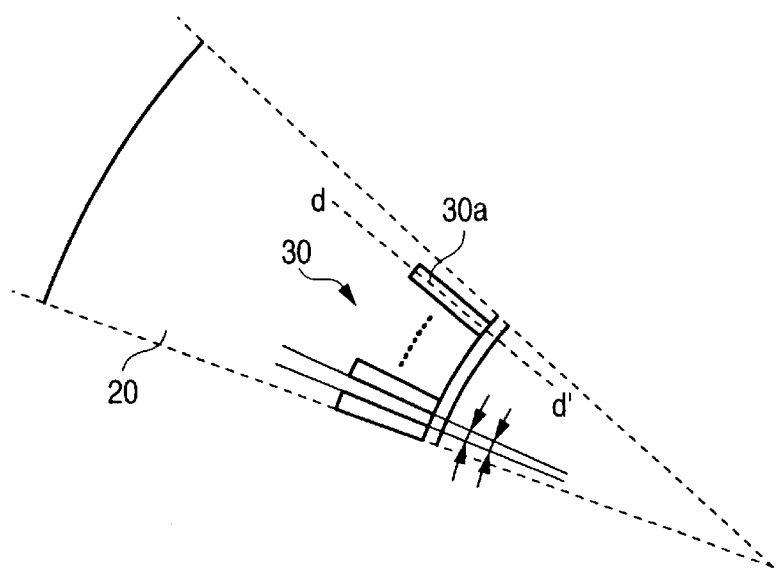
Figure 2:
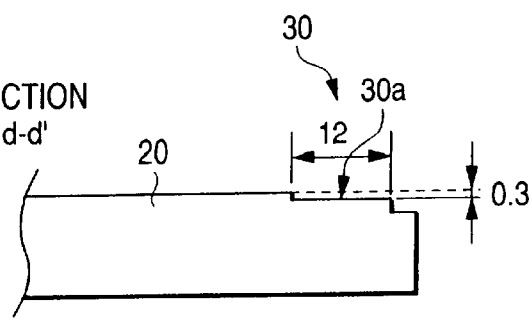

In the plasma processing apparatus 10, at least either the upper quartz plate 18 or the lower quartz plate 20 has a surface region that includes a plurality of sectioned areas divided by steps. As shown in FIG. 2, the quartz plate has a surface region that includes raised sections and recessed sections divided by steps in the vicinity of the electrode.

The chamber 12 of the plasma processing apparatus 10 is evacuated to about $10^{-4}$ Torr. The wafer 26 may also be held on the lower electrode 16 in any way other than electrostatic chuck, such as mechanical clamping. A plasma processing apparatus with mechanical clamping will be explained later.

The plasma processing apparatus 10 shown in FIG. 1 is a split-powered system in which both the upper and lower electrodes 14 and 16 are supplied with RF power from the RF power splitter 22. Other systems such as anode coupling system and cathode coupling system may also be used in the present invention.

The periphery of the upper and lower electrodes 14 and 16 is surrounded by the upper and lower quartz plates 18 and 20, respectively. The quartz plates 18 and 20 function as the focus ring to concentrate the plasma in the space between the parallel plate electrodes. The upper and lower quartz plates 18 and 20 can be detached for mechanical cleaning. Reaction products or byproducts produced in the plasma mainly deposit in the vicinities of the upper and lower electrodes 14 and 16, respectively of the upper and lower quartz plates 18 and 20. Deposition is remarkable particularly in the ring-shaped area, or circular band-shaped area, near the inner periphery of the lower quartz plate 20. The width of the region is about 12 mm. Therefore, steps in this region play an important role.

According to the present invention, surface regions of the upper and lower plates 18 and 20, on which reaction byproducts deposit, include a plurality of small sectioned areas divided by steps. That is, the surface regions is divided into raised sections and recessed sections by steps. This surface region is referred to as the stepped region hereinafter. Making the stepped region on the lower quartz plate 20 which is close to the lower electrode 16 is particularly desirable, because reaction byproducts deposit on this component remarkably.

The stepped region is particularly effective in the case where the plasma processing apparatus is provided with an electrostatic chuck, because peeled flakes of the deposited film near the periphery of the wafer is attracted to the electrostatic chuck. Then, the attracted flakes prevent the wafer from being chucked.

An example of the stepped region formed on the lower quartz plate 20 is shown in FIGS. 2(a)–(c). FIG. 2(a) is a top view. FIG. 2(b) is a partial enlarged view of the part a in FIG. 2(a). FIG. 2(c) is a partial sectional view taken along the line d—d' is FIG. 2(b).

On the surface of the lower quartz plate 20 is formed the stepped region 30 as shown in FIGS. 2(a), 2(b) and 2(c). Rectangular grooves 30a are radially arranged at prescribed intervals along the entire length of the annular-shaped inner periphery of the lower quartz plate 20. The stepped region 30 includes recessed sections at the bottoms of the grooves and raised sections between the grooves. In the case of the example shown, the grooves are arranged at intervals of 2 mm and each groove is 1 mm wide, 12 mm long, and 0.3 mm (300 $\mu$m) deep. The bottom of the rectangular groove 30a is substantially flat, and the surface of the raised section between the rectangular grooves 30a is also substantially flat.

The upper quartz plate 18 surrounding the upper electrode 14 also has the stepped region (not shown), which includes rectangular grooves (1 mm wide, 12 mm long, and 300 $\mu$m deep) radially arranged at intervals of 2 mm along the entire length of its inner periphery.

In order to confirm the effect of the present invention, an experiment was carried out with the plasma processing apparatus 10 shown in FIG. 1. Plasma is concentrated in the space between the upper and lower parallel plate electrodes 14 and 16 owing to the upper and lower quartz plates 18 and 20 surrounding the electrodes. Reaction byproducts deposit on the upper and lower quartz plates 18 and 20, particularly on the latter. Worked surface region 28 is formed on the lower quartz plate 20 close to the lower electrode 16 as shown in FIG. 3(a). The part a in FIG. 3(a) has various patterns as shown in FIGS. 3(b) to 3(e), which are partial enlarged views.

Pattern A is shown in FIG. 3(b), and its cross section taken along the line a—a' in FIG. 3(b) is shown in FIG. 3(f). Pattern A has the surface region 28 which is the original (unworked) surface of the lower quartz plate 20 formed by machining. The lower quartz plate 20 has a surface roughness as follows:

Ra (center-line mean roughness); 1.57 μm

Rz (ten-point mean roughness): 9.25 μm

Rmax (maximum height): 10.5 μm

Pattern B is shown in FIG. 3(c), and its cross section taken along the line b—b' in FIG. 3(c) is shown in FIG. 3(g). Pattern B has the surface region 28 with frost treatment 28b. The frost-treated region has a surface roughness as follows:

Ra (center-line mean roughness): 3.92 μm

Rz (ten-point mean roughness); 23.0 μm

Rmax (maximum height): 27.5 μm

Frost treatment is given to the area 15 mm wide along the inner periphery of the lower quartz plate 20.

Pattern C is shown in FIG. 3(d), and its cross section taken along the line c—c' in FIG. 3(d) is shown in FIG. 3(h). Pattern C has a concentric circular groove 30c formed by machining in the surface region 28 of the lower quartz plate 20. The groove makes the stepped region 30. The groove is 3 mm wide and 50 μm deep and located 2 mm away from the inner periphery of the surface of the lower quartz plate 20.

Pattern D is shown in FIG. 3(e), and its cross section taken along the line d—d' in FIG. 3(e) is shown in FIG. 3(i). Pattern D has grooves 30d formed by machining in the surface region 28 of the lower quartz plate 20. These grooves make the stepped region 30. They are rectangular grooves arranged in the redial direction at intervals of 2 mm. Each groove is 1 mm wide, 12 mm long, and 50 μm deep.

The grooves in patterns C and D were formed by mechanical grinding with a diamond tool. The bottom of the groove has a surface roughness which is almost the same as that of the surface of the quartz plate before grinding (Pattern A).

Figure 4:
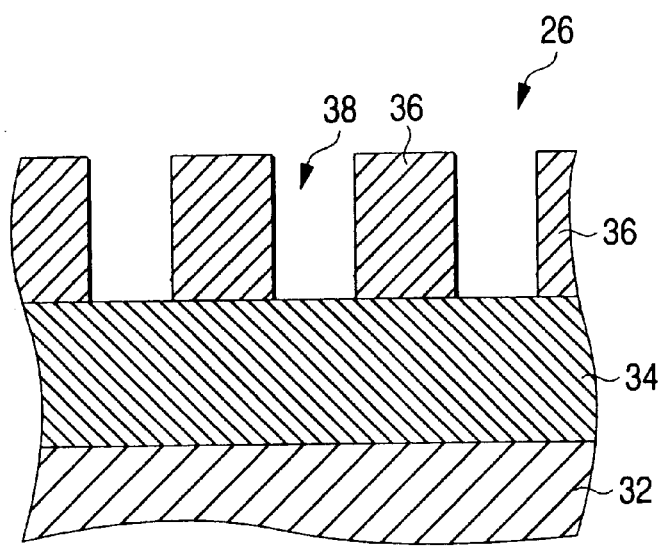
FIG. 4 is a partial sectional view showing a semiconductor wafer which undergoes plasma etching in the apparatus shown in FIG. 1.

The lower quartz plate 20 explained above was mounted in the plasma processing apparatus 10 shown in FIG. 1. The plasma processing apparatus 10 was run to generate reactive plasma for dry etching on the wafer 26. The wafer 26 includes a silicon substrate 32, a silicon dioxide film 34 (1.0 μm thick), and a patterned photoresist mask 36 (1.2 μm thick), as shown in FIG. 4. The mask has holes 38 of about 0.30 μm in diameter. The etchant gas for dry etching is a mixture of $CF_4$, $CHF_3$, and Ar. The conditions for plasma generation are shown in Table 1.

TABLE 1

| Discharging pressure | RF power density | Gas flow rate (sccm) | | | Temperature of lower electrode | Temperature of upper electrode |
| --- | --- | --- | --- | --- | --- | --- |
| (mTorr) | (W/cm$^2$) | $CF_4$ | $CHF_3$ | Ar | (° C.) | (° C.) |
| 250 | 4.80 | 20 | 20 | 500 | −10 | 30 |

The results of the experiment are shown in Table 2 in terms of the peeling of deposited film which occurred when a number of wafers underwent the dry etching successively. The cumulative plasma discharge time is the total of plasma discharge time required to process individual wafers. In the case of pattern A, the deposited film peels in the entire region after about 25 hours of plasma discharge. In the case of pattern B, the deposited film peels in 10% of the region after 20 hours of plasma discharge and in the entire region after 35 hours of plasma discharge.

TABLE 2

| Type of pattern | Cumulative plasma discharge time | | | | | |
| --- | --- | --- | --- | --- | --- | --- |
| | 15 hour | 20 hours | 25 hours | 30 hours | 35 hours | 40 hours |
| Pattern A | 25 | 50 | 100 | 100 | 100 | 100 |
| Pattern B | 0 | 10 | 25 | 50 | 100 | 100 |
| Pattern C | 0 | 0 | 0 | 0 | 0 | 0 |
| Pattern D | 0 | 0 | 0 | 0 | 0 | 0 |

(unit: %) In terms of ratio of the region in which deposited film peels to the entire region.

It is noted from Table 2 that pattern B with minute surface irregularities formed by frost treatment helps the deposited film to stick to the quartz plate more firmly than pattern A. However, pattern B does not greatly improve the operation rate in view of the fact that particles appear when the deposited film begins to peel.

By contrast, patterns C and D having the stepped region (30c and 30d) according to the present invention did not permit the deposited film to peel even after 40 hours of plasma discharge. This indicates that patterns C and D are more effective than pattern B with frost treatment for minute surface irregularities in preventing the deposited film from peeling.

The adhesion strength of deposited films was measured by the peeling method after 20 hours of plasma discharge. The results are shown in Table 3.

TABLE 3

| Pattern A | Pattern B | Pattern C | Pattern D |
| --- | --- | --- | --- |
| <3 | 3–7 | 20–30 | >30 | unit: × 10$^5$ dyne/cm$^2$

It is noted from Table 3 that the adhesion strength is lower than $3\times10^5$ dyne/cm$^2$ for pattern A, $3–7\times10^5$ dyne/cm$^2$ for pattern B, $20–30\times10^5$ dyne/cm$^2$ for pattern C, and higher than $30\times10^5$ dyne/cm$^2$ for pattern D. This indicates that patterns C and D provide greater adhesion strength than pattern B (conventional frosting treatment). The adhesion strength of pattern D is about 10 times as large as that on the untreated region.

It is known well that a deposited film peels when its internal stress exceeds it adhesion strength to the underlying surface. In addition to this general knowledge, the above-mentioned experimental results suggest the following. That is, the tendency of peeling is related with the absolute amount of displacement by the internal stress of the deposited film. The amount of displacement is defined as follows, assuming that the deposited film is one-dimensional.

Amount of displacement=(Internal stress of deposited film×Length of deposited film)/(Young's modulus of deposited film)

This means that the greater the internal stress of a deposited film and the larger the size of the deposited film, the more readily the deposited film peels. In addition, the experimental results suggest that adequate steps on the underlying surface effectively limit the size of the deposited film. The fact that pattern D provides greater adhesion strength than pattern C presumably results from the fact that the deposited film on pattern D is finely, or effectively, divided by the steps.

The reaction byproduct deposit in a ring-shaped area on the surface of the quartz plate in the vicinity of the electrode, as mentioned above. The deposited film can be divided more effectively by the radial pattern D than by the concentric pattern C.

In the experiment with pattern A, the deposition of reaction byproduct was visually examined after plasma discharge for 20 hours. It was found that deposition is remarkable in a circular zone about 12 mm wide from the inner periphery of the lower quartz plate 20. It was also found that cracks occurred in the radial directions and the deposited film peels. A probable reason for the radial cracking is that an internal stress in the circumferential direction was developed due to a temperature cycle. The temperature of the deposited film changes as plasma is turned on and off, and the deposited film expands and shrinks as the temperature changes, thereby developing the internal stress in the circumferential direction.

Therefore, "Length of deposited film" in the above equation may be considered as the length in the circumferential direction. In the case of pattern D, "Length of deposited film" is small because the ring-shaped deposited film is divided into small sections in the circumferential direction. As the result, "Amount of displacement of deposited film" is limited and the peeling is effectively prevented.

Figure 5:
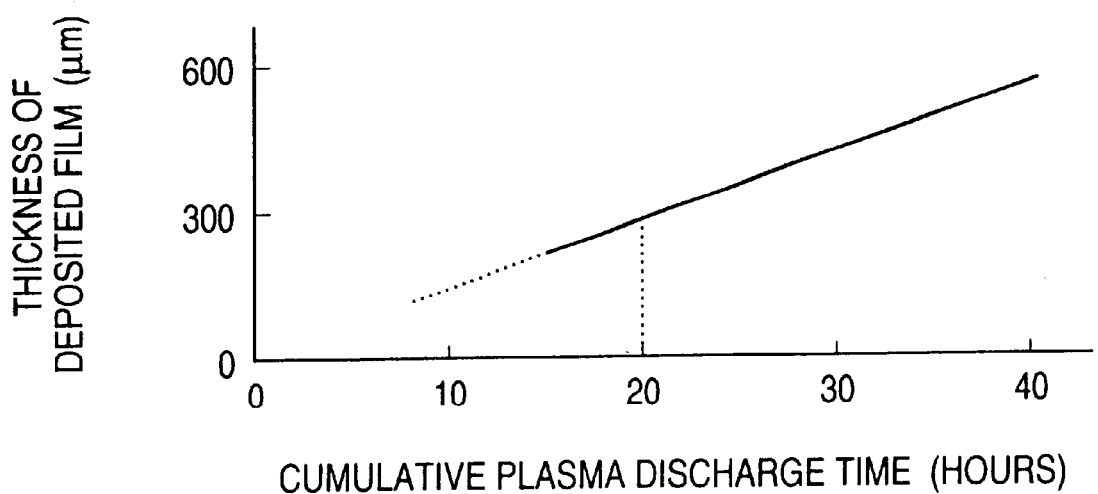
FIG. 5 is a graph showing the relationship between the cumulative plasma discharge time and the thickness of the film of deposited material which forms while the apparatus for plasma etching (shown in FIG. 1) is operating.
Figure 6:
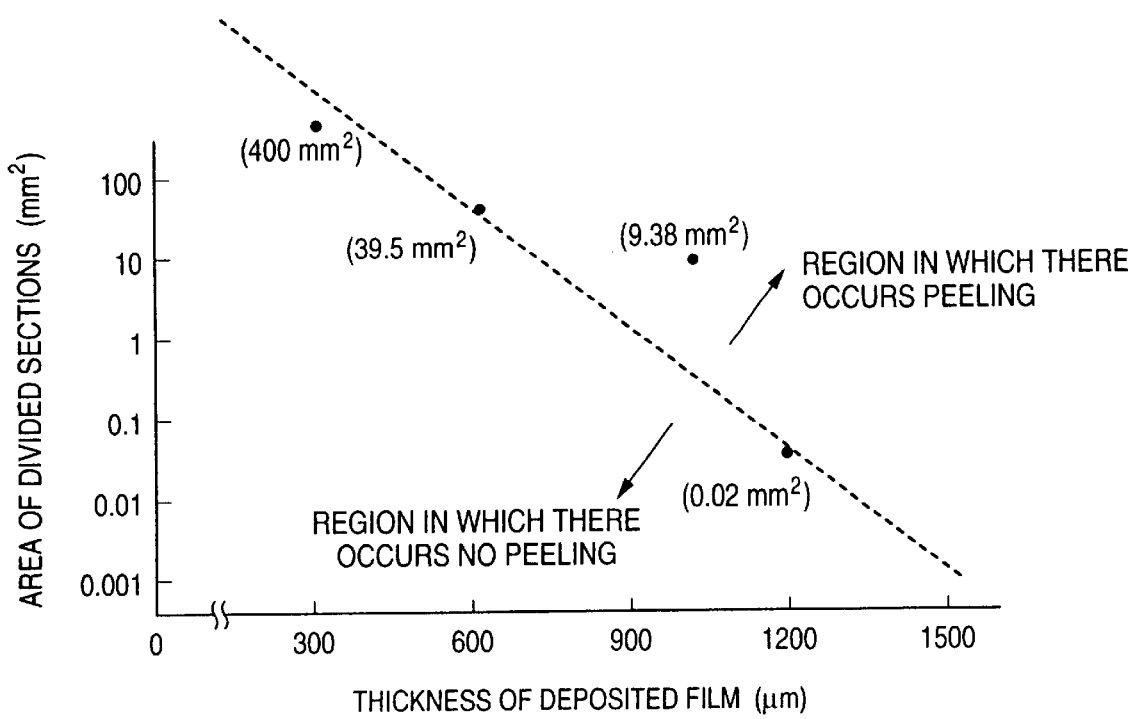
FIG. 6 is a graph showing regions in which the peeling of depended film does or does not occur on the relationship between the thickness of deposited film and the area of divided sections on the lower quartz plate used in plasma etching shown in FIG. 1.

The effect of dividing the deposited film is supported by data shown in FIGS. 5 and 6. FIG. 5 shows the relationship between the cumulative plasma discharge time and the thickness of the deposited film. The graph tells us that reaction byproduct builds-up about 300 $\mu$m thick after plasma discharge for 20 hours, and the thickness increases in proportion to the cumulative plasma discharge time at least to the discharge time of about 40 hours. The deposited film of hundreds of $\mu$m in thickness has a great internal stress. When the thickness exceeds a certain limit, the internal stress overrules the adhesion strength of the film, causing the film to peel.

The peeling of deposited film depends on the thickness as well as the area of divided sections, as shown in FIG. 6. In other words, the smaller the area of the sectioned area, the thicker the film that can be adhered to the surface. For example, the film that can be adhered is about 300 $\mu$m thick, 600 $\mu$m thick, and 1200 $\mu$m thick when the area of divided sections is 400 mm$^2$, 39.5 mm$^2$, and 0.02 mm$^2$, respectively. The step to divide into individual sections is 50 $\mu$m high. The data in FIG. 6 not only confirm the previous finding that the larger is the stress of the deposited film, the more readily the peeling occurs, but also provide the present inventors' finding that it is possible to prevent peeling if the size of deposited film is limited by the sectioned areas divided by steps.

The area of divided sections is determined so as to effectively prevent the peeling of the film by limiting the size of the film. It is also determined by the ease of working. If the deposited film is about 300 $\mu$m thick, the area of the divided section should be smaller than about 400 mm$^2$. For a thickness of about 600 $\mu$m, the area should be smaller than about 40 mm$^2$. An experimentally confirmed lower limit is 0.02 mm$^2$, as shown in FIG. 6. This lower limit may be further lowered to about $1 \times 10^{-3}$ mm$^2$. In practice, an area of about 0.5 mm$^2$ or above is adequate in consideration of the ease of working.

Meanwhile, the thickness of deposited film is about 300 $\mu$m thick after discharging for 20 hours, and the thickness increases in approximate proportion to discharging time. The height (50 $\mu$m) of the step in patterns C and D is much smaller than the thickness of the deposited film. The fact that the step with such a small height produces the effect of preventing peeling suggests that whether or not the deposited film peels depends on the amount of displacement in a boundary layer with a certain thickness in the vicinity of the substrate (the quartz plate). Under the etching conditions shown in Table 1, the certain thickness seems to be less than about 50 $\mu$m and is possible to be divided by the step with 50 $\mu$m high.

In addition, even if the step height is less than the thickness of the deposited film, the width of grooves, or the distance between adjacent raised sections is sufficiently large. In the case of Pattern D, for example, the distance is 1 mm. This distance is about 3.3 times larger than the film thickness after 20 hours of plasma discharge, about 1.7 times larger than the thickness after 40 hours of plasma discharge, and, assuming a proportion build-up until 50 hours of plasma discharge, about 1.3 times larger than the thickness after 50 hours of plasma discharge. Further, the thickness shown in FIG. 5 is the maximum thickness at the inner periphery of the lower quartz plate 20. The thickness decreases at positions remote from the periphery. In addition, the deposition of the plasma reaction byproducts does not usually proceed conformably on a stepped substrate. That is, thickness on the side wall of the step is thinner than that on the raised section. Therefore, it is believed that the steps between raised sections and recessed sections do not disappear even after the prolonged plasma discharge at least on a substantial portion of the stepped region. That is, even after the prolonged plasma discharge, the film deposits on a stepped substrate, and the steps effectively divide the film, thereby preventing the deposited film from peeling.

There is another known way of increasing the adhesion strength of deposited films. It is known as "nailing" due to surface irregularities. The effect of nailing varies depending on the height of the step. This is inferred from the fact that pattern B with minute irregularities permits deposited film to peel more easily than patterns C and D with sectioned areas divided by the step.

Figure 7:
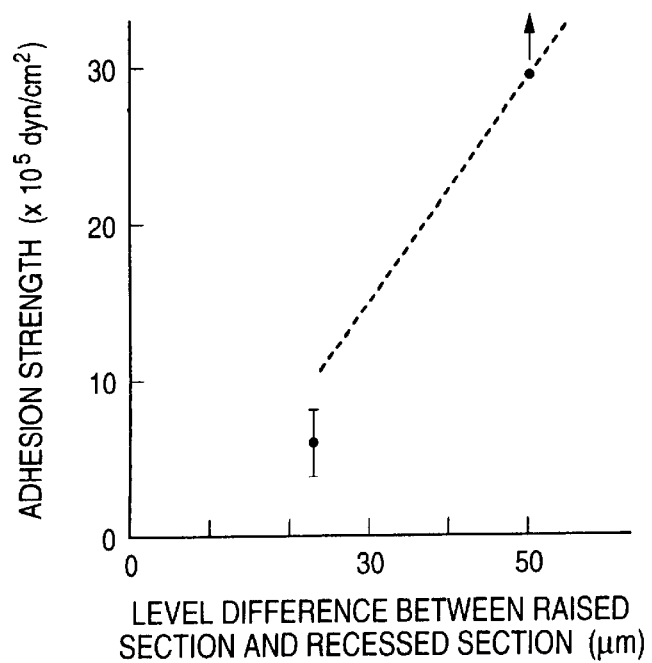
FIG. 7 is a graph showing the relationship between the adhesion strength of deposited film and the height of steps, which is observed when the apparatus for plasma etching shown in FIG. 1 is provided with the lower quartz plate having a stepped region with pattern D shown in FIGS. 3(e) and 3(i).

The foregoing is supported by the data shown in FIG. 7. FIG. 7 is a graph showing the relationship between the adhesion strength of deposited film after discharging for 20 hours and the height of the step in pattern D having divided sections whose areas are 12 mm$^2$. FIG. 7 shows that the higher the step height, the larger the adhesion strength.

As the deposited film becomes thicker, and the stress of the film increases, the deposited film becomes more readily to peel. However, if the step is made higher in response to the increase of the thickness, the deposited film is less liable to peel. The experimental results in Table 3 showed that deposited films are liable to peel when the adhesion strength is 3–7×10$^5$ dyne/cm$^2$ or less. If steps of 30 $\mu$m high are formed, the adhesion strength is 15×10$^5$ dyne/cm$^2$, and the peeling at the discharge time of 20 hours is completely prevented. If the step height is further increased to 50 $\mu$m, the adhesion strength is 30×10$^5$ dyne/cm$^2$ and above.

The step of 30 $\mu$m high seems to be very small for the deposited film of 300 $\mu$m thick. However, it is understood that even such a small step produces an effect of nailing to a certain degree. In addition, the film thickness of 300 $\mu$m is much smaller than the pattern dimension of 12 mm$^2$. This suggests that densely formed irregularities are not essential for the nailing to produce its effect and that one or more steps higher than a certain height in a certain area are enough. It is considered that the step pins the deposited film or produces a "pinning effect".

The fact that pattern B with frost treatment does not effectively prevent peeling may be interpreted as follows.

Frost treatment merely forms minute irregularities on the surface of the quartz plate. The maximum height (Rmax) of irregularities is only 27.5 µm. Such minute irregularities produce neither a remarkable effect of dividing the deposited film nor a remarkable nailing effect. In addition, these irregularities are formed such that the raised sections and the recessed sections are connected continuously by slopes and hence sectioned areas clearly defined by steps are not formed. Therefore, they are limited in the effect of dividing the deposited film and thereby limiting the amount of displacement. Even if it is possible to increase the height, adjacent raised sections are so close to each other that the recessed portion between the adjacent raised sections is readily filled with reaction byproducts deposited therein. As a result, the deposited film cannot be divided effectively. In other words, frost treatment does not form a recessed section with a sufficient area or width, which is clearly defined by steps, necessary to divide the deposited film.

By contrast, pattern C or D on the surface of the quartz plate has a plurality of sectioned areas clearly divided by steps of 50 µm high. The step produces the effect of pinning the deposited film. The recessed section, or the bottom of the groove, is 1 mm wide. Thus, deposited film on the raised sections and recessed sections are effectively divided, thereby limiting the amount of displacement.

Consequently, the steps to divide the raised and recessed sections according to the present invention should preferably be high enough to prevent the deposited film from peeling. For example, the step should be higher than 30 µm, preferably higher than 50 µm, as shown in FIG. 7. This height of the step corresponds to about 10% or 17% of the thickness (about 300 µm) of the deposited film for 20 hours of plasma discharge. The higher the step, the greater the adhesion strength. Therefore, it is desirable to increase the height further. For example, in the case of the step 300 µm high, particles due to peeling were not found even after 50 hours of cumulative plasma discharge time during which the deposited film builds-up to about 750 µm thick, the the build-up proceeds in proportion of the plasma discharge time. The actual data of the particle numbers will be explained later. In this case, the height of the step is about 40% of the film thickness. As a matter of course, reaction byproducts deposit at different rates depending on the type and operating conditions of the processing apparatus. Likewise, required cumulative processing time, or sum of processing times for processing individual wafers, between mechanical cleanings to realize desired operation rate differs from one apparatus to another. The step to prevent peeling should be determined according to the estimated thickness of the film builds-up during the cumulative processing time.

The step should be as great as possible from the standpoint of preventing peeling. However, it the height of the step is equal to or greater than the thickness of the deposited film, increasing the height further produces little additional effect. It is not desirable to form steps higher than necessary in consideration of the strength of the component to be worked and the difficulty in working. In addition, an excessively high step will produce an adverse effect on the processing. For example, in the case of a processing apparatus that employs a gas ambient, an excessively high step will disturb the gas flow, thereby disturbing the processing. Therefore, the step should have an adequate height not detrimental to the gas flow.

This experiment was carried out with the plasma processing apparatus 10 of narrow-gap parallel plate type as shown in FIG. 1. This apparatus is constructed such that the plasma is effectively confined in the space between the upper electrode 14 and the lower electrode 16. This structure causes reaction byproducts to be produced in large amounts, and forms a deposited film in the vicinity of the region where the plasma terminates. Therefore, the stepped region should be positioned in the vicinity of the wafer 26 or the electrode 14 or 16 where reaction byproducts deposit considerably. The stepped region thus positioned effectively prevents the deposited film from peeling.

Next, the effect of the arrangement direction of the raised and recessed sections will be discussed. This experiment was carried out using a plasma apparatus of parallel plate type. The apparatus of this type gives rise to a temperature gradient around the center of plasma in the processing chamber. In the case where the processing chamber is provided with a heating source or a cooling zone, their combined effect produces a temperature gradient. The deposited film has an internal stress in the direction of the temperature gradient. In addition, the internal stress may also be produced resulting from thickness variation because the thickness of deposited film varies due to the temperature gradient. To prevent peeling due to the stress in the direction of the temperature gradient, a stepped region with raised and recessed sections arranged along the isotherm line of the temperature gradient, as in the case of pattern C, is effective.

In single-wafer processing apparatus, periodic temperature fluctuation occurs as plasma is turned on and off. In this case, the internal stress of the deposited film increases as the temperature fluctuation reaches a maximum, and the internal stress develops along the isotherm line of the temperature gradient. To prevent peeling due to the stress in the direction along the isothermal line, raised and recessed sections arranged along the normal of the isotherm line, i.e., along the direction of temperature gradient, as in the case of pattern D, is effective.

A significant temperature gradient develops in so-called low-temperature etching which is carried out in such a way that the lower electrode, on which the wafer is mounted, is cooled to, for example, about −50° C. this etching method is applied to, for example, an insulating film with a low dielectric constant. In the low-temperature etching, reaction byproducts tend to form a thick film because reaction byproducts deposit at a greater rate as the temperature decreases. As a result, the deposited film is more liable to peel. This can be effectively avoided if the stepped region is formed according to the present invention or the pattern of steps is arranged according to the temperature gradient.

Temperature fluctuation due to turn-on and off of plasma is larger and faster on interior components made with metal or silicon having a high thermal conductivity. The result is that the deposited film is liable to peel. This can be effectively avoided if the stepped region is formed according to the present invention or the pattern of steps is arranged according to the temperature gradient.

The present invention is intended to prevent peeling of deposited film builds-up on interior components in the processing chamber of a plasma processing apparatus. The principle of the present invention may also be applied to prevent the coating layer on the surface of interior components from dropping off. The coating includes alumina coating formed by anodizing an aluminum base. Anodized aluminum coating is used to coat interior components including inner wall of the processing chamber itself. Unfortunately, alumina coating layer is liable to peel or drop off from the aluminum base when it is heated above 130° C., due to the difference in thermal coefficient of expansion. In single-wafer plasma processing apparatus, in which surfaces of interior components get hot due to continuous operation. If the stepped region according to the present invention is provided on the alumina coated surface of the interior component, the dropping off of the coated layer is effectively prevented.

EXAMPLES

The processing apparatus of the present invention will be described with reference to Examples that follow.

Example 1

This example demonstrates a plasma processing apparatus for dry etching.

FIG. 1 shows the plasma processing apparatus 10 for day etching. FIG. 2 shows the lower quartz plate 20 used in the plasma processing apparatus 10. FIG. 4 shows a wafer 26 of a semiconductor device having a silicon dioxide film 34 to be etched.

As mentioned above, the lower quartz plate 20 has the stepped region 30 on its surface near its inner periphery. The stepped region 30 includes rectangular grooves 30a arranged radially at intervals of 2 mm. Each groove is 1 mm wide, 12 mm long, and 300 $\mu$m deep. See also pattern D in FIGS. 3(e) and 3(i). The upper quartz plate 18 surrounding the upper electrode 14 also has the stepped region 30 on is surface near its inner periphery. The stepped region 30 includes rectangular grooves 30a arranged radially at intervals of 2 mm. Each groove is 1 mm wide, 12 mm long, and 300 $\mu$m deep.

In this example, pattern D was selected because its effect had been confirmed as shown in Table 3. The groove was made 12 mm long in view of the fact that visually apparent deposition was confirmed in an area 12 mm wide after 20 hours of cumulative plasma discharge time. In other words, an annular region of 12 mm wide was divided in the circumferential direction, and the deposited film on this region is substantially completely divided in the circumferential direction. Although it has been confirmed that the step 50 $\mu$m high is effective as shown in Table 3, the step was made 300 $\mu$m high, leaving a margin. This height corresponds to the thickness of the deposited film which builds-up during 20 hours of cumulative plasma discharge time.

Figure 8:
FIG. 8 is a schematic sectional view of the groove formed in the lower quartz plate of the apparatus for plasma etching shown in FIG. 1.

The actually machined groove has a cross sectional shape as shown in FIG. 8. The cross section of the groove as a whole has a rectangular shape. However, the side wall of the groove is not exactly perpendicular to the surface of the quartz plate. In addition, it has small surface irregularities. The lower end of the side wall is rounded. Nonetheless, a substantial portion of the side wall has an angle larger than about 80°. In other words, the side wall is substantially vertical, or the step formed by the groove extends substantially perpendicular to the sectioned areas.

For comparison, dry etching was performed on the silicon dioxide film 34 using the upper and lower quartz plates 18 and 20 which have unmachined flat surfaces as shown in FIGS. 3(b) and 3(f).

The chamber 12 was evacuated to about $10^{-6}$ Torr, and the wafer 26 was fixed to the lower electrode 14 via the electrostatic chuck 17.

The chamber 12 was supplied with an etchant gas through the gas inlet 13. The etchant gas includes $CF_4$, $CHF_3$, and Ar. The plasma processing apparatus 10 was activated by applying RF power to the upper and lower electrodes by the split system. Plasma was generated under the condition shown in Table 1.

As mentioned above, the plasma processing apparatus 10 is constructed such that the upper and lower electrodes 14 and 16 are surrounded by the upper and lower quartz plates 18 and 20, respectively, and the plasma is concentrated in the space between the parallel plate electrodes. Because of this structure, reaction byproducts build-up on that part of the upper and lower quartz plates 18 and 20 which are close to the electrodes.

Dry etching was carried out by using the upper and lower quartz plates 18 and 20 which have stepped regions 30 made by radially arranged rectangular grooves 30a. Dry etching was also carried out by using the upper and lower quartz plates 18 and 20 which have flat surfaces. Results of dry etching using quartz plates with and without stepped regions are shown in Table 4. There is no noticeable difference between them in the etching rate and etching uniformity of the silicon dioxide film 34. Also, there is no noticeable difference between them in the etching rate of polysilicon. This means that there is no difference in substrate selectivity defined as the quotient of the etching rate of silicon dioxide divided by the etching rate of polysilicon. This selectivity is important in the dry etching of silicon dioxide in production of semiconductor integrated circuits. There is no noticeable difference between them in the taper angle of etched hole and the pattern shift (difference between the diameter of the hole etched in silicon dioxide and that of the aperture in resist). Specifically, thee is no noticeable difference in etching a small hole about 0.3 $\mu$m in diameter and about 1.0 $\mu$deep. There results suggest that the upper and lower quartz plates with the stepped region 30 formed by radially arranged rectangular grooves as shown in FIGS. 3(e) and 3(i) have no adverse effects on the fundamental performance of the dry etching.

The apparatus shown in FIG. 1 has the upper and lower quartz plates 18, 20 with a gap of about 2 mm between them. Therefore, the step of 300 $\mu$m formed on the quartz plate corresponds to about 15% of this gap. It was confirmed that this step doses not disturb the gas flow and alter the plasma and etching characteristics.

TABLE 4

| Item of evaluation | with conventional quartz plates | with worked quartz plates |
| --- | --- | --- |
| Etching rate of silicon dioxide | 703.6 nm/min | 692.0 nm/min |
| Uniformity of etching rate of silicon dioxide | 4.1% | 3.2% |
| Etching rate of polysilicon | 78.2 nm/min | 76.4 nm/min |
| Uniformity of etching rate of polysilicon | 5.9% | 6.2% |
| Pattern shift for 0.30 $\mu$m hole | -0.074 $\mu$m | -0.075 $\mu$m |
| Etched taper angle for 0.30 $\mu$m hole | 87.7° | 87.5° |

Figure 9:
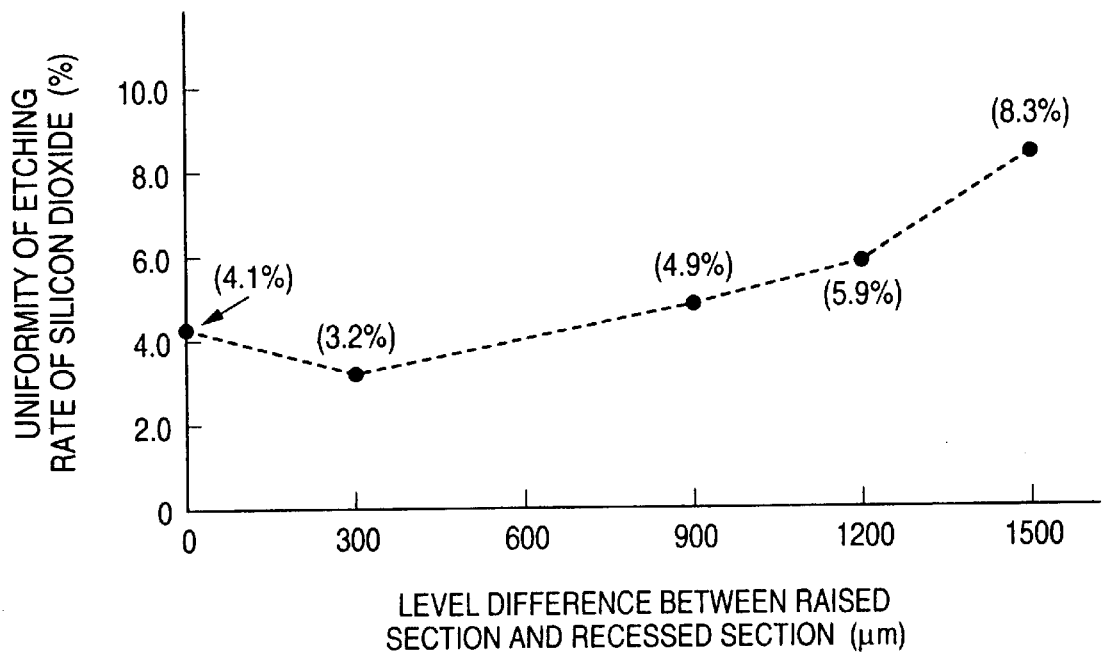
FIG. 9 is a graph showing the relationship between the height of step and the etching uniformity of silicon dioxide, which is observed when the apparatus for plasma etching shown in FIG. 1 is provided with the lower quartz plate having steps of pattern D shown in FIGS. 3(e) and 3(i).

However, if the step height is increased, the etching characteristics, particularly the etching uniformity, are adversely affected. FIG. 9 is a graph showing the relationship between the step height and the uniformity of etching rate for silicon dioxide. The etching apparatus shown in FIG. 1 is equipped with the lower quartz plate having the stepped region of pattern D shown in FIGS. 3(e) and 3(i) with various step heights. It is noted from FIG. 9 that the uniformity becomes poor (4.9%) if the step is 900 $\mu$m high, and the uniformity becomes poorer (greater than 5%) if the step s 1200 $\mu$m (1.2 mm) high. Presumably this is because the stepped region disturbs the gas flow, which alters the plasma and etching characteristics. Therefore, the height of that step should be lower than about 1.5 mm, preferably lower than about 1 mm.

The apparatus shown in FIG. 1 is an etching apparatus of narrow-gap type, with the upper and lower quartz plates 18 and 20 only about 2 mm away from each other. The step heights of 300 μm and 1 mm, mentioned above, correspond to about 14% and 50%, respectively, of this gap. The step height is limited as mentioned above so that it can be applied to the components for such a narrow gap. In other apparatus and components, it is also desirable to limit the step height to such an extent that the gas flow is not disturbed. The actual upper limit of the step height varies depending on individual apparatus and components.

Figure 10:
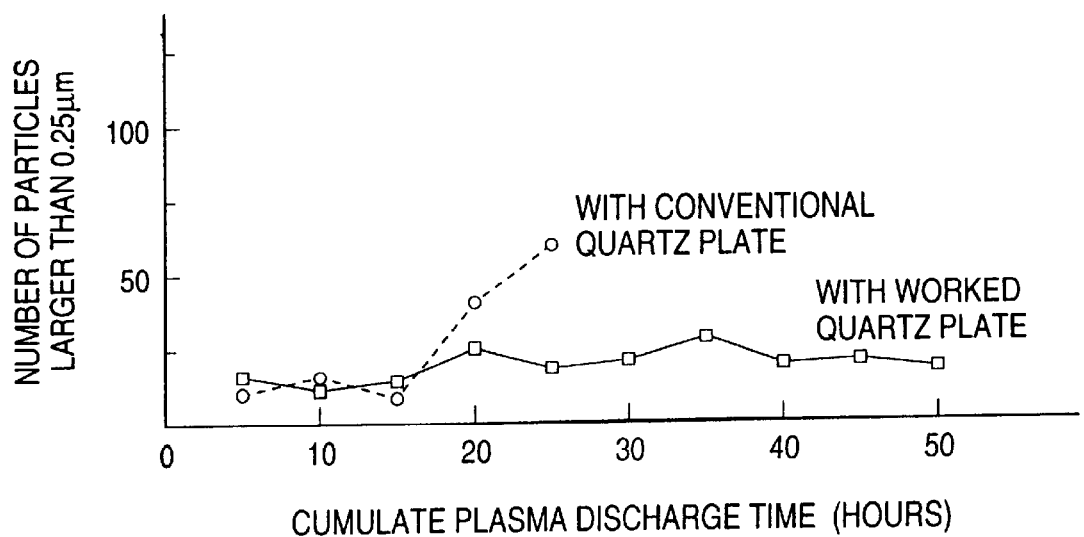
FIG. 10 is a graph showing the relationship between the cumulative plasma discharge time and the number of particles in the chamber, which is observed when the apparatus for plasma etching shown in FIG. 1 is provided with the lower quartz plate having a stepped region with pattern D according to the present invention or with the conventional lower quartz plate.

FIG. 10 is a graph showing the relationship between the cumulative plasma discharge time and the number of particles on the wafer processed in the chamber 12. It is noted from FIG. 10 that the number of particles larger than 0.25 μm is less than 30 after 50 hours of cumulative plasma discharge time if the upper and lower quartz plates have stepped regions 30 formed by radially arranged rectangular grooves 30a. For comparison, dry etching was also carried out by using the upper and lower quartz plates 18 and 20 with a flat surface as machined. In this case the number of particles larger than 0.25 μm increased after 20 hours of cumulative plasma discharge time.

It was also found that yields of semiconductor integrated circuits fabricated using the plasma etcher shown in FIG. 1 remain the same. That is, the stepped region 30 formed by radially arranged grooves 30a in the upper and lower quartz plates 18 and 20 has no adverse effect on yields. In addition, the yields do not decrease even after 40 hours of cumulative plasma discharge time. Moreover, mechanical cleaning in the conventional way did not wear out the pattern on quartz plates because the step height of the grooves in stepped region 30 in the upper and lower quartz plates 18 and 20 is sufficiently high.

It is apparent from the foregoing that the length of continuous operation of the plasma processing apparatus was more than double owing to the stepped region 30 which characterizes the present invention. The result is the reduced frequencies of mechanical cleaning and the increased operation of the apparatus.

The etching apparatus equipped with the quartz plates with radially arranged grooves have been continuously used for about one year in actual production of semiconductor devices. During this period, there has been no trouble due to the grooves and a high operation rate has been maintained. In addition, continuous operations for 70 hours of cumulative plasma discharge time (in excess of 50 hours of operation shown in FIG. 10) have been repeatedly achieved. In fact, the number of particles has not increased even after the 70 hours of cumulative discharge time. Further continuous operation seems possible. Meanwhile, it was confirmed that the deposited film does not peel after the 70 hours of discharge even though the intervals of the grooves are extended to 4 mm, with the groove width kept constant at 1 mm. However, the deposited film cracked when the intervals were extended to 6 mm. The deposited film on the upper quartz plate 18 is about one-half as thick as that on the lower quartz plate 20. Therefore, the deposited film on the upper quartz plate 18 did not peel even though the groove depth was reduced to 200 μm.

After the continuous operation for 70 hours of plasma discharge, the used quartz plate is cleaned for repeated use. The deposited film can be removed without damage to the quartz plate. That is, portions of the film on raised sections are removed when the used plate is dipped in an organic solvent. And the portions in the grooves are removed by brushing. The fact that the portions between the grooves are removed separately from those in the grooves indicates that the film deposited during the 70 hours of continuous operation is effectively divided by the groove of 1 mm wide and 300 μm deep. The grooved pattern and the continuous operation for 70 hours of plasma discharge did not affect the life of the quartz plate.

The area on which visually apparent deposition occurs on the lower quartz plate 20 becomes wider after 70 hours of plasma discharge than after 20 hours of plasma discharge. Therefore, it is desirable to lengthen the radially arranged grooves so that the deposited film is completely divided in the circumferential direction. This seems to be an effective method to extend further the length of continuous operation.

The deposited film after continuous operation for a long time has a thickness distribution in the radial direction. This thickness distribution induces an internal stress. An effective way to prevent peeling due to this internal stress is to form a circular groove like pattern C in addition to the radially arranged grooves. Such a circular groove divides the deposited film in the radial direction. In other words, the deposited film is divided two-dimensionally by the two-dimensional pattern combined with patterns C and D rather than being divided one-dimensionally by one-dimensional pattern C or D individually. Two-dimensional division may produce a better effect in preventing the peeling. However, we have not, if fact, observed cracks in circular direction even after 70 hours of cumulative plasma discharge time. In addition, the two-dimensional groove pattern leads to an increased production cost and a decreased strength of the quartz plate. Moreover, it present difficulties in removing deposited film in the recessed part when the plate is cleaned. Removal would be possible with a chemically active cleaning solution that can remove the deposited film solely by chemical etching. However, this has the possibility of damaging the plate and reducing the life of the plate.

With all the foregoing factors taken into account, it was concluded that the radial one-dimensional pattern is desirable for the quartz plates 18 and 20 in the etching apparatus used in this Example.

The step to divide sectioned areas should preferably be substantially vertical such as shown in FIG. 8 so that the deposited film can be effectively divided. For example, the step or side wall of the groove should preferably have an average angle greater than about 75°, more preferably greater than about 80°. However, it is not necessary that the side wall be exactly vertical. The angle necessary for the effective division varies depending on the composition of the deposited film and reaction mechanism to produce the film. Therefore, the step should be made in an adequate shape according to the apparatus and components on which the stepped region is formed and operating conditions of the apparatus, so long as the angle of the step is sufficient large to effectively divide the deposited film. What is important, in addition to the angle, is the presence of a distinct critical point between the side walls and the divided sectional areas. In other words, the sectioned areas should be divided by distinct steps.

In this Example, the grooves are 1 mm wide. This width may be varied within a certain range. However, it is not desirable to make the groove width excessively large so that the stepped region effectively prevents peeling of deposited film. In this Example, if the lower quartz plate 20 of the etching apparatus has grooves, each 1 mm wide, arranged at intervals of 6 mm, i.e., if the width of raised section between adjacent grooves is 5 mm, the deposited film cracks, as mentioned above. In consideration of this, it is desirable that the groove width should also be smaller than 5 mm. Off course, however, the maximum width may vary depending on the apparatus and components on which the stepped region is formed and operating conditions of the apparatus.

On the other hand, the width of the groove should be sufficiently large, as mentioned above, so that the step does not disappear during the necessary continuous operation time at least on a substantial area on which the film of deposited material is formed. If the width is too marrow, films deposited on adjacent side walls join and the steps disappear. In this Example, the width of 1 mm was confirmed to be sufficient to effectively divide the deposited film on the lower quartz plate 20 built-up during 70 hours of cumulative plasma discharge time. As mentioned above, this width is larger than the film thickness deposited during 40 hours of plasma discharge. The minimum width may vary depending on the apparatus and components on which the stepped region is formed and operating conditions of the apparatus. In general, however, it is desirable that the width is larger than, or at least comparable with, the film thickness deposited during the cumulative operation time between mechanical cleanings required to achieve the necessary operation rate. On the other hand, in consideration of the ease of working, the groove width should preferably be larger than about 0.5 mm if the grooves are formed by mechanical grinding.

In sum, grooves should be provided to provide steps suitable to divide the deposited film built-up during a cumulative processing time predetermined to achieve a required operation rate. That is, a depth of the groove (a height of the step) should be sufficiently high, an angle of side walls of the groove (an angle of the step) should be sufficiently large, a width of the groove (a distance between adjacent raised sections divided by the steps) should be sufficient large but should not be excessively large, and an interval of the grooves (a width of the raised section) should not be too large so that the deposited film is effectively divided. The film need not to be divided in distinct sections. However, the film should be effectively divided to limit the length of the deposited film and the amount of displacement so that peeling of the film is prevented.

In this example, a plurality of grooves having the same shape are provided with the same interval. The present invention is not limited to this example so long as the grooves provides steps sufficient to effectively divide the deposited film.

Figure 11:
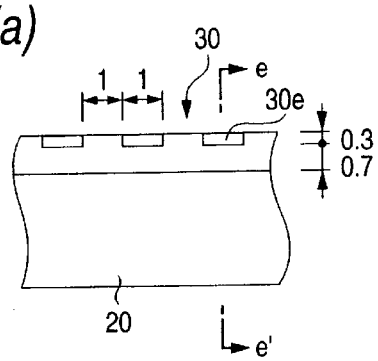
FIG. 11(a) is a front view of another lower quartz plate used in the apparatus for plasma etching shown in FIG. 1.
FIG. 11(b) is a partial sectional view taken along the line 3—e' in FIG. 11(a).
Figure 11:
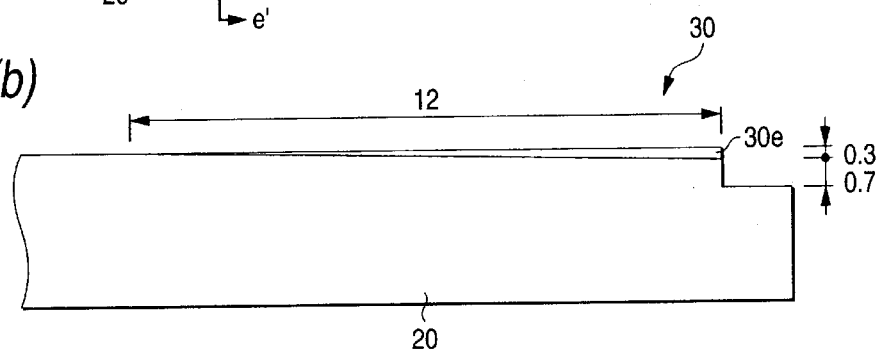
Figure 12:
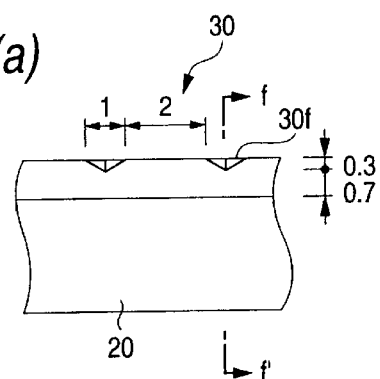
FIG. 12(a) is a front view of another lower quartz plate used in the apparatus for plasma etching shown in FIG. 1.
FIG. 12(b) is a partial sectional view taken along the line f—f' in FIG. 12(a).
Figure 12:
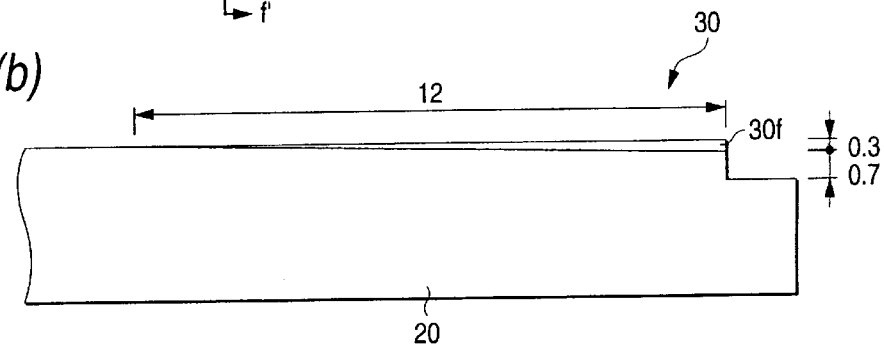

Accordingly to the present invention, sectioned areas of the stepped region 30 are divided by steps. These sectioned areas are not limited to those whose entire periphery is bounded by steps. What is important is to divide the surface on which film of deposited material is formed during operation, or the surface on which the deposited film should adhere with certain strength, into sectioned areas. The stepped region 30 of the present invention is not limited in its shape so long as it has the step to divide a plurality of sectioned areas. The step should be high enough to prevent the peeling of deposited film. For example, the step should preferably be higher than 30 μm at least partly. The lower quartz plate 20 shown in FIGS. 11(*a*) and 11(*b*) has stepped region 30 including sectioned areas divided by rectangular inclined grooves 30*e*. The lower quartz plate 20 shown in FIGS. 12(*a*) and 12(*b*) has stepped regions 30 including sectioned areas divided by V-shape included grooves 30*f*.

The apparatus in this example has a chamber 12 of simple symmetrical structure. In such a case, symmetrical repeated pattern is particularly effective, such as radially arranged rectangular grooves 30*a* and 30*d* shown in FIGS. 2(*a*), 2(*b*), and 2(*c*) and FIGS. 3(*e*) and 3(*i*)) or concentric circular grooves 30*c* shown in FIGS. 3(*d*) and 3(*h*)).

The sectioned areas in the stepped region 30 should preferably be arranged in a regular pattern. However, the present invention is not restricted to this.

The sectioned areas in the stepped part 30 should preferably by substantially flat. However, they need not be completely flat. In fact, the machined surface has a certain degree of surface roughness. If this surface roughness is significantly smaller than the step height, then the sectioned areas divided by the step may be considered substantially flat. Moreover, conventional frost treatment can be used in combination with the grooves formed by mechanical grinding. In this case, the sectioned areas may be considered substantially flat even though the sectioned areas are partly or entirely roughened so long as the roughness is considerably smaller than the step that divides the sectioned areas. It is permissive to make individual sections, as a whole, with a curvature. Curved sections are inevitably formed if the stepped region is formed on a curved surface of a component. It may be possible to form curved sections if a tool with curved surface is used for mechanical grinding. Thus, grooves with a round bottom can be formed. Even in these cases, the sectioned areas may be considered substantially flat if the radius of curvature is large and the variation in height in each section is sufficiently small compared with the height of the step that divides the sectioned areas.

The plasma processing apparatus 10 used in this example is designed such that the wafer 26 is fixed to the lower electrode 16 via an electrostatic chuck. It is also possible to use the plasma processing apparatus 40 as shown in FIG. 13 which is provided with a mechanical clamp.

Figure 13:
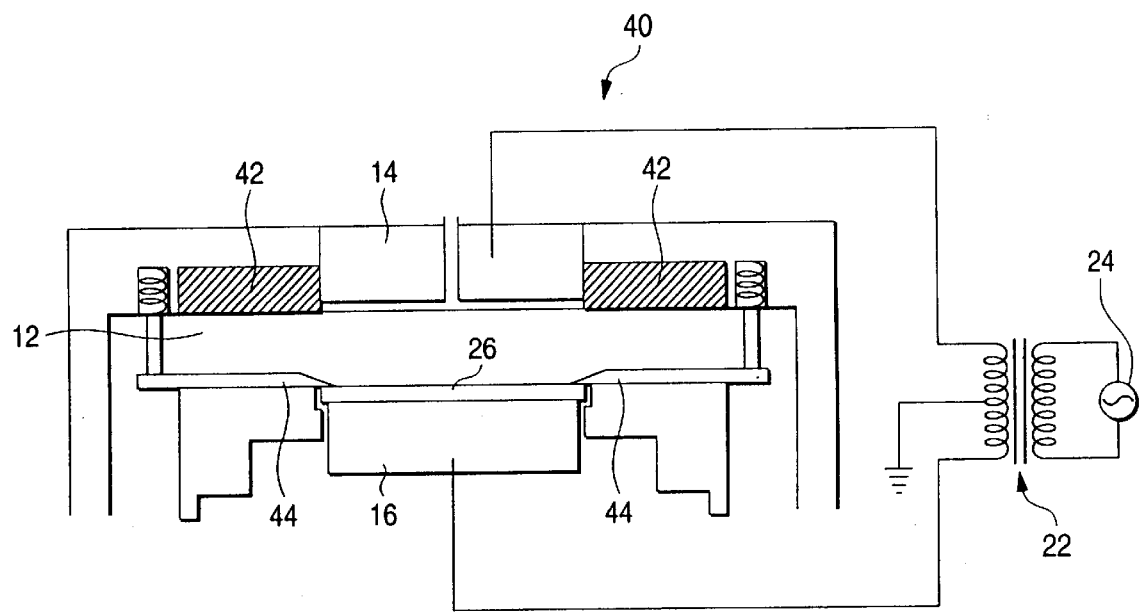
FIG. 13 is a schematic sectional view showing another embodiment of the apparatus for plasma etching according to the present invention.

The plasma processing apparatus 40 shown in FIG. 13 is basically the same as the apparatus 10 shown in FIG. 1, except for the method of fixing the wafer 26 to the lower electrode 16 and for the structure of the plate surrounding the upper and lower electrodes 14 and 16. Therefore, the identical components are given the same reference numbers and their explanation is omitted.

The plasma processing apparatus 40 is a dry etching apparatus of narrow-gap parallel plate structure. It is constructed of the chamber 12, the upper electrode 14 having the gas inlet 13, the lower electrode 16, the anodized aluminum plate 42 surrounding the upper electrode 14, the anodized aluminum clamping ring (mechanical clamp) 44 which opposes the anodized aluminum plate 42 and surrounds the lower electrode 16, the RF power splitter 22, and the RF power supply 24.

The plasma processing apparatus 40 shown in FIG. 13 is characterized in that at least either of the anodized aluminum plate 42 or the anodized aluminum clamping ring 44 has a surface having a plurality of sectioned areas divided by steps in the vicinity of the upper and lower electrodes 14 and 16. The sectioned areas include raised sections or recessed sections which are divided by the step. See FIGS. 2 and 3.

It was confirmed that the mechanical clamp provided with the stepped region according to the present invention does not cause anomalous discharge and does not adversely affect the etching performance. The plasma processing apparatus 40 shown in FIG. 13 is provided with an anodized aluminum mechanical clamp 44 on which the stepped region 30 is formed. The stepped region 30 has pattern D or pattern C. The stepped region 30 thus formed has no adverse effect on the processing performance. In addition, it allowed the apparatus to run continuously for a longer time because it prevents the deposited film from peeling.

In above described examples, the idea of the present invention is applied to plasma processing apparatus for dry etching. However, these examples are not intended to limit the scope of the present invention. The idea of the present invention may also be applied to a variety of processing apparatus, such as CVD apparatus which has a processing chamber subject to deposition of reaction products or byproducts. The present invention may be effectively applied to the processing apparatus for production of semiconductor integrated circuits, particular those with small devises.

Example 2

This example demonstrates a plasma processing apparatus for dry etching.

Figure 14:
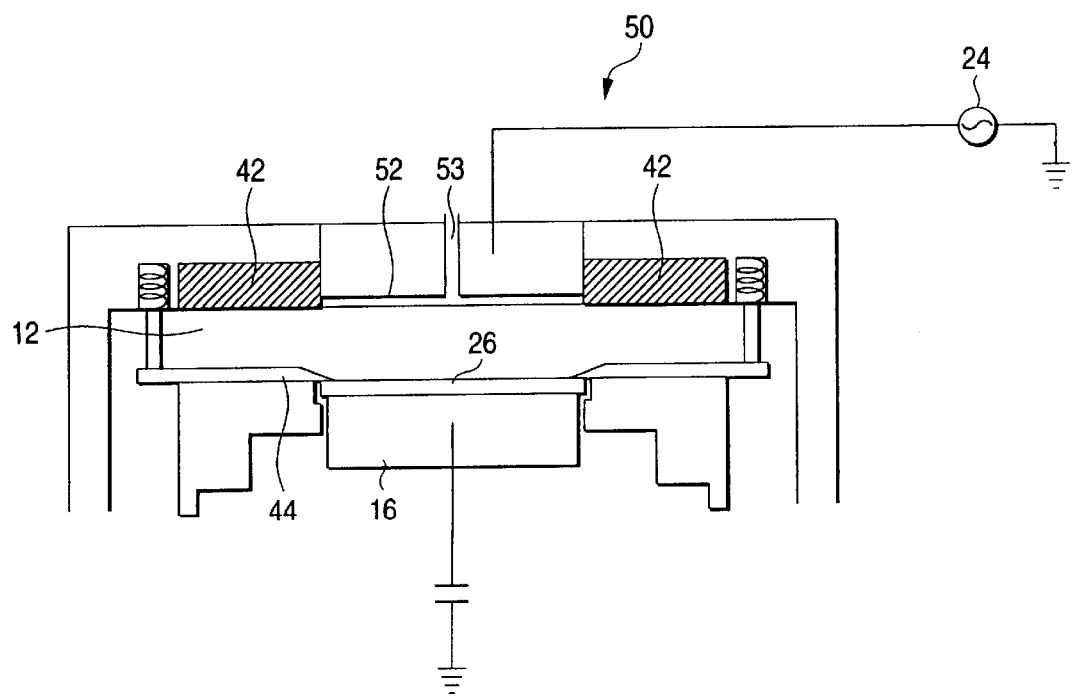
FIG. 14 is a schematic sectional view showing yet another embodiment of the apparatus for plasma etching according to the present invention.

The plasma processing apparatus 50 used in this example is schematically shown in section in FIG. 14. It is basically the same as the plasma processing apparatus 40 shown in FIG. 13, except for the structure of the upper electrode 52. Therefore, the identical components are given the same reference numbers and their explanation is omitted.

The plasma processing apparatus 50 shown in FIG. 14 is a dry-etching apparatus of narrow-gap parallel plate structure. It is constructed of a chamber 12, an upper electrode 52 of anodized aluminum, an lower electrode 16, an anodized aluminum plate 42 surrounding the upper electrode 52, an anodized aluminum clamping ring 44, and an RF power supply 24 for power supply to the upper electrode 52. The upper electrode 52 is placed at the upper central position of the chamber 12, and it has the etching gas inlet 53. The gas inlet is provided with a plurality of gas injected holes 55 through which the etching gas is supplied into the chamber 12. The clamping ring 44 is under and opposite to the plate 42 and surrounds the lower electrode 16. The clamping ring 44 mechanically clamps downward the periphery of the wafer 26 placed on the lower electrode 16.

The plasma processing apparatus 50 has the anode coupling system to supply the upper electrode 52 with RF power. The anode coupling system may be replaced by the cathode coupling system or the split-powered system.

The upper electrode 52 is surrounded by the plate 42 of anodized aluminum, and the lower electrode 16 is surrounded by the clamp 44 of anodized aluminum. Further, in this example, the upper electrode 52 itself is made of anodized aluminum.

Figure 15:
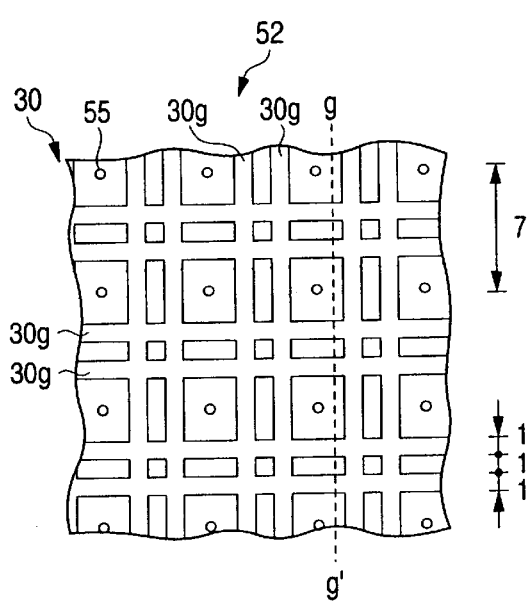
FIG. 15(a) is a top view showing the upper electrode with anodized aluminum coating layer used in the apparatus for plasma etching shown in FIG. 14.
FIG. 15(b) is a partial sectional view taken along the line g—g' in FIG. 15(a).
Figure 15:
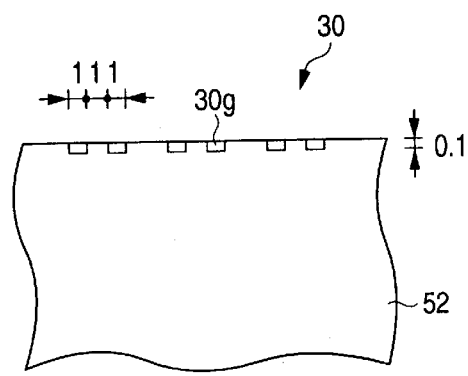

The upper electrode 52 of anodized aluminum has its surface machined so as to form the stepped region 30 which characterizes the present invention. The stepped region 30 formed by machining in the aluminum base of the upper electrode 52 was anodized to form an alumina coating layer about 20 $\mu$m thick. FIG. 15 shows the surface of the aluminum base or the surface of the upper electrode 52 which oppose to the wafer 26. There are grooves 30g, 1 mm wide and 100 $\mu$m deep, which are arranged mutually perpendicularly at intervals of 2 mm. Between the grooves are gas inlet holes 55, which are 0.5 mm in diameter.

The plasma processing apparatus 50 in this example is need for dry etching of polysilicon film 35. For comparison, the process is also made using an apparatus equipped with an upper electrode having a flat surface without grooves.

Figure 16:
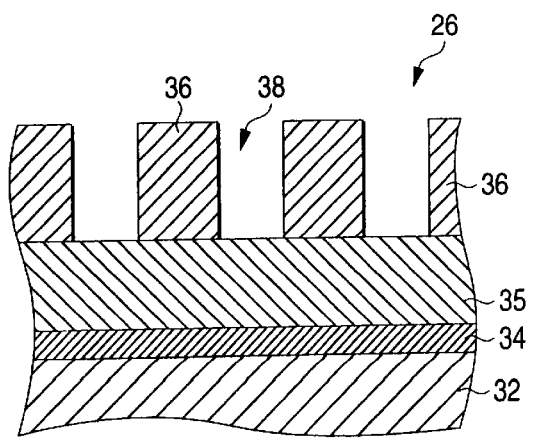
FIG. 16 is a partly sectional view showing a semiconductor wafer which undergoes plasma etching in the apparatus shown in FIG. 14.

The wafer 26 used in this example has the structure as shown in FIG. 16. It includes a silicon substrate 32, a silicon dioxide film 34 (10 nm thick), a polysilicon film 35 (0.25 $\mu$m thick), and a photoresist mask 36 (1 $\mu$m thick) having a line width of about 0.35 $\mu$m. Dry etching is carried out with a mixed gas of chlorine and oxygen. Plasma was generated under the condition shown in Table 5 below.

TABLE 5

| Pressure (mTorr) | RF power density (W/cm$^2$) | Gas flow rate (sccm) | | Temperature of lower electrode (° C.) | Temperature of upper electrode (° C.) |
| --- | --- | --- | --- | --- | --- |
| | | Chlorine | Oxygen | | |
| 500 | 1.60 | 150 | 20 | 50 | 50 |

The performance of dry etching with the flat upper electrode was compared with that with the grooved upper electrode. The results are shown in Table 6. There is no noticeable difference in the etching rate and etching uniformity for the polysilicon film 35. There is no noticeable difference either in the etching rate for the silicon dioxide film. This means that there is no noticeable difference in substrate selectivity defined as the quotient of the etching rate of polysilicon divided by the etching rate of silicon dioxide. This selectivity is important in the dry etching of polysilicon in production of semiconductor integrated circuits. This result suggests that the stepped region having cross-hatched patterned grooves 30g on the upper electrode 52 have no adverse effect on the basic performance of the dry etching. Conventionally, the upper electrode 52 is usually constructed with components having flat surfaces so as to avoid concentrated electric field and anomalous discharge at discharge at discontinuous portions. Contrary to this common practice, it has been shown that steps of about 100 $\mu$m do not affect the plasma discharge and do not hinder the processing performance.

TABLE 6

| Item of evaluation | with conventional electrode of anodized aluminum | with worked electrode of anodized aluminum |
| --- | --- | --- |
| Etching rate of polysilicon | 310.8 nm/min | 307.5 nm/min |
| Uniformity of etching rate of | 3.3% | 2.9% |
| Etching rate of silicon dioxide | 20.5 nm/min | 20.2 nm/min |
| Uniformity of etching rate of silicon | 8.1% | 7.5% |
| Pattern shift for 0.35 $\mu$m line | −0.010 $\mu$m | −0.012 $\mu$m |

Figure 17:
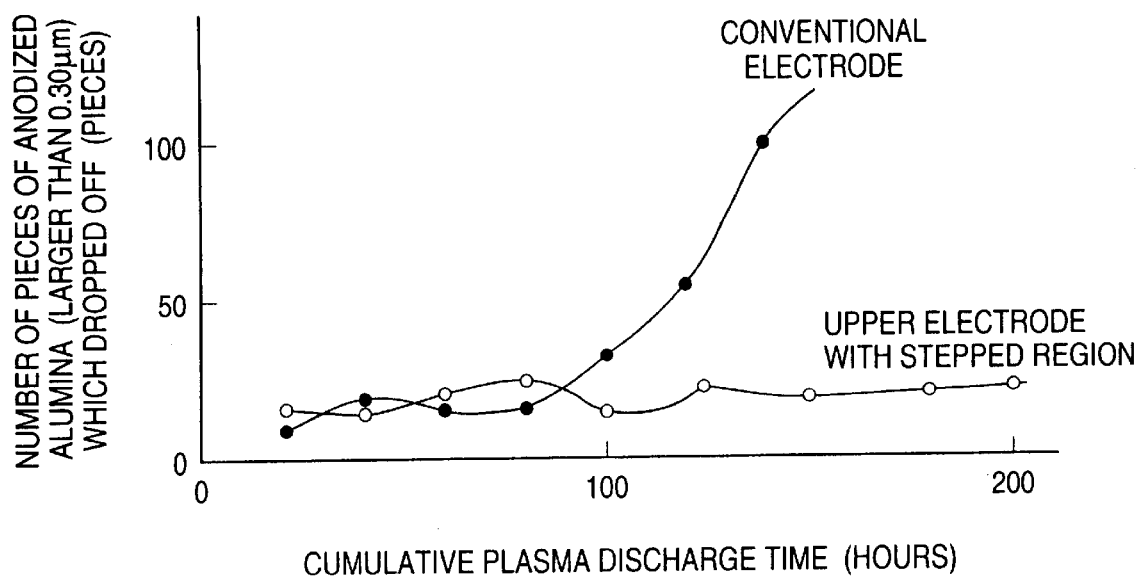
FIG. 17 is a graph showing the relationship between the cumulative plasma discharge time and the number of particles of dropped alumina coating layer, which is observed when the apparatus for plasma etching shown in FIG. 14 is provided with the upper electrode having stepped regions according to the present invention or the conventional upper electrode.

When the plasma processing apparatus 50 shown in FIG. 14 was run continuously for dry etching, the alumina coating layer drops off on the wafer 26. The number of dropped particles varies as shown in FIG. 17 depending on whether the plasma processing apparatus 50 is provided with the grooved upper electrode or the flat upper electrode. It is noted from FIG. 17 that the number of dropped particles larger than 0.30 $\mu$m is less than 30 after 200 hours of cumulative plasma discharge time in the case of dry etching with the grooved upper electrode 52. By contrast, the number of dropped particles increases after 100 hours of discharge time in the case of dry etching with the conventional flat upper electrode. This result suggests that the conventional upper electrode permits continuous processing for only 100 hours of cumulative plasma discharge time.

It was also confirmed that the grooved upper electrode has no adverse effect on the yields of semiconductor integrated circuits, even after 200 hours of cumulative plasma discharge time.

The results in this example show that the plasma processing apparatus of the present invention permits twice as long continuous operation as the conventional one and also reduces the running cost.

In the foregoing examples, the present invention is applied to dry etching apparatus. It is shown that the processing apparatus according to the present invention effectively prevents peeling of film of deposited material or coating layer on interior components when wafers undergo dry etching in the production of semiconductor devices such as integrated circuits. The present invention is not limited to such applications. It may be applied to any apparatus by forming a stepped region composed of plurality of sectioned areas divided by steps on a surface of at least one interior component on which film of deposited material or surface coating is made.

The quartz plate with the stepped region which was demonstrated in this example may be replaced by a plate with the same stepped region made with different materials such as a ceramics plate. In addition, the present invention may also be applied to any interior components in addition to the focus ring and clamp shown in these examples. For example, a bell jar of an etching apparatus of ECR type or ICP type may be provided with the stepped region according to the present invention. The present invention may also be suitably applied to CVD apparatus and sputtering apparatus. In etching or CVD apparatus, the deposited film includes reaction product or byproduct produced in the etching or CVD gas atmosphere. While, in the sputtering apparatus, the deposited film on the interior component includes the same material deposited on the semiconductor substrate.

In the forgoing examples, the present invention was applied to narrow gap type apparatus which has difficulties in dry cleaning. If an apparatus capable of dry cleaning is provided with the stepped region according to the present invention, it is possible to decrease the frequency of dry cleaning and to increase the operation rate.

The foregoing explanation made with reference to examples is applied to the processing apparatus of the present invention and the method of preventing deposited film or coating layer by using the apparatus. The present invention is not limited to the above-mentioned examples. It is possible to modify the present invention in various ways within the scope thereof.

As mentioned above, the present invention produces the effect of preventing deposited film and coating layer on interior components in a processing chamber from peeling and decreasing the number of particles in the chamber, thereby improving the operation rate while maintaining the performance and yields unaffected. Thus the present invention is of great industrial importance.

What is claimed is:

1. A focus ring for surrounding a semiconductor substrate in a plasma processing apparatus, comprising:
    a stepped region formed in a vicinity of an inner periphery of the focus ring that surrounds the semiconductor during processing, the stepped region including a plurality of raised sections divided by at least one groove;
    wherein:
    a film of deposited material is formed on the stepped region during the processing; and
    a depth of the groove is sufficiently large to effectively divide the deposited film and is sufficiently small so that the groove does not disturb a flow of a gas supplied onto the semiconductor substrate during processing.

2. The focus ring according to claim 1, wherein the processing apparatus includes electrodes for generating a plasma and the focus ring concentrates the plasma in a space between the electrodes.

3. The focus ring according to claim 1, wherein the groove includes a plurality of grooves generally perpendicular to the inner periphery of the focus ring.

4. The focus ring according to claim 1, wherein the groove is a circular groove.

5. The focus ring according to claim 1, wherein the film is formed on a ring-shaped area, and the groove includes a plurality of grooves generally perpendicular to a circumferential direction of the ring-shaped area.

6. The focus ring according to claim 1, wherein the stepped region forms a gap in the processing apparatus with a second focus ring facing to the first focus ring, and the depth is not larger than about 15% of the gap.

7. The focus ring according to claim 1, wherein the depth is not larger than 300 µm.

8. A focus ring for surrounding a semiconductor substrate in a plasma processing apparatus, comprising:
    a stepped region formed in a vicinity of an inner periphery of the focus ring that surrounds the semiconductor substrate during the processing, the stepped region including a plurality of raised sections divided by at least one groove;
    wherein;
    a film of deposited material is formed on the stepped region during the processing; and
    the groove is arranged only in the vicinity of the inner periphery.

9. The focus ring according to claim 8, wherein the processing apparatus includes electrodes for generating a plasma and the focus ring concentrates the plasma in a space between the electrodes.

10. The focus ring according to claim 8, wherein the groove includes a plurality of grooves generally perpendicular to the inner periphery.

11. The focus ring according to claim 8, wherein the groove is a circular groove.

12. The focus ring according to claim 8, wherein the film is formed on a ring-shaped area, and the groove includes a plurality of grooves generally perpendicular to a circumferential direction of the ring-shaped area.

13. A focus ring for surrounding a semiconductor substrate in a plasma processing apparatus, comprising:
    a stepped region formed in a vicinity of an inner periphery of the focus ring that surrounds the semiconductor substrate during the processing, the stepped region including a plurality of raised sections divided by steps;
    wherein;
    a film of deposited material is formed on the stepped region during processing; and
    the steps are sufficiently high so that the film is effectively divided and are sufficiently low so that the steps do not disturb a flow of a gas supplied onto the semiconductor during the processing.

14. The focus ring according to claim 13, wherein the processing apparatus includes electrodes for generating a plasma and the focus ring concentrates the plasma in a space between the electrodes.

15. The focus ring according to claim 13, wherein the stepped region forms a gap in the processing chamber with a second focus ring to the first focus ring, and the steps are not higher than about 15% of the gap.

16. The focus ring according to claim 13, wherein the steps are not higher than 300 µm.

17. A focus ring for surrounding a semiconductor substrate in a plasma processing apparatus, comprising:
    a stepped region formed in a vicinity of an inner periphery of the focus ring that surrounds the semiconductor substrate during the processing, the stepped region including a plurality of raised sections divided by steps;
    wherein;
    a film of deposited material is formed on the stepped region during the processing; and
    the steps are arranged only in the vicinity of the inner periphery of the focus ring.

18. The focus ring according to claim 17, wherein the processing apparatus includes electrodes for generating a plasma and the focus ring concentrates the plasma in a space between the electrodes.

* * * * *